(12) United States Patent
Yau et al.

(10) Patent No.: US 9,052,789 B2
(45) Date of Patent: Jun. 9, 2015

(54) TOUCH STRUCTURE AND MANUFACTURING METHOD FOR THE SAME

(71) Applicant: INDUSTRIAL TECHNOLOGY RESEARCH INSTITUTE, Chutung, Hsinchu (TW)

(72) Inventors: Bao-Shun Yau, Kaohsiung (TW); Su-Tsai Lu, Hsinchu (TW); Chun-Ting Liu, Baoshan Township, Hsinchu County (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 278 days.

(21) Appl. No.: 13/871,693

(22) Filed: Apr. 26, 2013

(65) Prior Publication Data

US 2014/0124241 A1 May 8, 2014

(30) Foreign Application Priority Data

Nov. 8, 2012 (TW) .............................. 101141603 A

(51) Int. Cl.
*G06F 3/044* (2006.01)
*H05K 1/02* (2006.01)
*H05K 3/46* (2006.01)

(52) U.S. Cl.
CPC ........... *G06F 3/044* (2013.01); *Y10T 29/49165* (2015.01); *H05K 1/0289* (2013.01); *H05K 3/4685* (2013.01)

(58) Field of Classification Search
CPC ....... G06F 3/44; H05K 1/0289; H05K 3/4685
See application file for complete search history.

(56) References Cited

U.S. PATENT DOCUMENTS 7,864,503 B2 1/2011 Chang
2008/0264699 A1 10/2008 Chang et al.
2009/0160824 A1 6/2009 Chih-Yung et al.
(Continued)

FOREIGN PATENT DOCUMENTS

TW M342558 10/2008
TW M354119 4/2009
(Continued)

OTHER PUBLICATIONS

Brown, Chris et al., Late-News Paper: In-Cell Capacitance Touch-Panel with Improved Sensitivity, SID 10 Digest, 2010, pp. 346-349.
(Continued)

*Primary Examiner* — Jeremy C Norris
(74) *Attorney, Agent, or Firm* — Muncy, Geissler, Olds & Lowe, P.C.

(57) ABSTRACT

A touch structure and a manufacturing method for the same are provided. The touch structure comprises first patterned electrodes, a second patterned electrode, a dielectric structure and a conductive bridge. The second patterned electrode is disposed between the first patterned electrodes, and separated from the first patterned electrodes. The dielectric structure is disposed on the first patterned electrodes and the second patterned electrode. The dielectric structure has a dielectric opening. The conductive bridge is disposed across the dielectric structure and extended in the dielectric opening. The first patterned electrodes are electrically connected to each other through the conductive bridge.

10 Claims, 8 Drawing Sheets

(56) References Cited

U.S. PATENT DOCUMENTS

| | | |
|---|---|---|
| 2009/0242283 A1 | 10/2009 | Chiu |
| 2010/0000803 A1 | 1/2010 | Yang |
| 2010/0283757 A1 | 11/2010 | Wu et al. |
| 2011/0018838 A1 | 1/2011 | Lee |
| 2011/0163983 A1 | 7/2011 | Maki |
| 2011/0193801 A1 | 8/2011 | Jung et al. |
| 2012/0098791 A1 | 4/2012 | Hamada et al. |
| 2012/0127112 A1 | 5/2012 | Lu et al. |

FOREIGN PATENT DOCUMENTS

| | | |
|---|---|---|
| TW | M370134 | 12/2009 |
| TW | M375934 | 3/2010 |
| TW | M378432 | 4/2010 |
| TW | M380535 | 5/2010 |
| TW | 201020893 | 6/2010 |
| TW | M387317 | 8/2010 |
| TW | 201135314 A1 | 10/2011 |
| TW | 201205395 | 2/2012 |
| TW | 201209689 A | 3/2012 |

OTHER PUBLICATIONS

Kung, Chen-Pang et al., Ultra-Thin High-Transparency Projective Capacitive Touch Sensing Film, SID 10 Digest, 2010, pp. 449-452.

Hwang, Sang-Soo et al., On-cell Projected Capacitive Type Touch Sensor for NBPC, SID 10 Digest, 2010, pp. 677-679.

Tseng, Shih-Feng et al., Laser scribing of indium tin oxide (ITO) think films deposited on various substrates for touch panels, Elsevier Applied Surface Science, 2010, pp. 1487-1494.

Kim, Hong-Ki et al., Capacitive tactile sensor array for touch screen application, Elsevier Sensors and Actuators A: Physical, 2011, pp. 2-7.

TOUCH STRUCTURE AND MANUFACTURING METHOD FOR THE SAME

This application claims the benefit of Taiwan application Serial No. 101141603, filed Nov. 8, 2012, the disclosure of which is incorporated by reference herein in its entirety.

TECHNICAL FIELD

The disclosure relates in general to a touch structure and a manufacturing method for the same, and more particularly to a touch structure whose dielectric structure has a dielectric opening and a manufacturing method for the same.

BACKGROUND

The future display technology is directed towards more user friendly man-machine interface. Conventional panel operation relies on mechanical buttons. As flat display is getting more and more popular, touch panel has become a mainstream product which replaces other input device such as keyboard and mouse and makes the use of information products easier and more conveniently. Therefore, the age of touch panel which is easy to operate has come. Touch panel can be used in various products such as vehicle touch panel (vehicle navigator), game machine, public information system (such as vending machine, automatic teller machine (ATM), navigation system), industrial purpose information products, small electronic products (such as personal digital assistant (PDA)), e-book. The competition in the display industry is intense, and main players comprise Japan, Taiwan, Korea and China. Almost global main manufacturers in the display industry are proactively engaged in the research and development of the touch panel technology, and the market demand is expected to experience significant growth in the coming years.

Along with the popularity of iPhone, global sale of smart phones increases rapidly, and the market potential in the hardware and application services of the smart phones cannot be underestimated. Therefore, the breakthrough in the projected capacitive touch panel has attracted more and more manufacturers' interest in the research and development in multi-touch technology and the production of the products using the same. The research and development in the industries are now focused on the elevation of the operating efficiency of the touch structure.

SUMMARY

According to one embodiment, a touch structure is provided. The touch structure comprises first patterned electrodes, a second patterned electrode, a dielectric structure and a conductive bridge. The second patterned electrode is disposed between the first patterned electrodes, and separated from the first patterned electrodes. The dielectric structure is disposed on the first patterned electrodes and the second patterned electrode. The dielectric structure has a dielectric opening. The conductive bridge is disposed across the dielectric structure and extended in the dielectric opening. The first patterned electrodes are electrically connected to each other through the conductive bridge.

According to another embodiment, a manufacturing method of a touch structure is provided. The method comprises following steps. First patterned electrodes are disposed on the substrate. The second patterned electrode is disposed on the substrate. The second patterned electrode is disposed between the first patterned electrodes. The dielectric structure is disposed on the first patterned electrodes and the second patterned electrode. A dielectric opening is formed in the dielectric structure. The conductive bridge is disposed across the dielectric structure and extended in the dielectric opening. The first patterned electrodes are electrically connected to each other through the conductive bridge.

The above and other aspects of the disclosure will become better understood with regard to the following detailed description of the non-limiting embodiment(s). The following description is made with reference to the accompanying drawings.

Figure 1A:
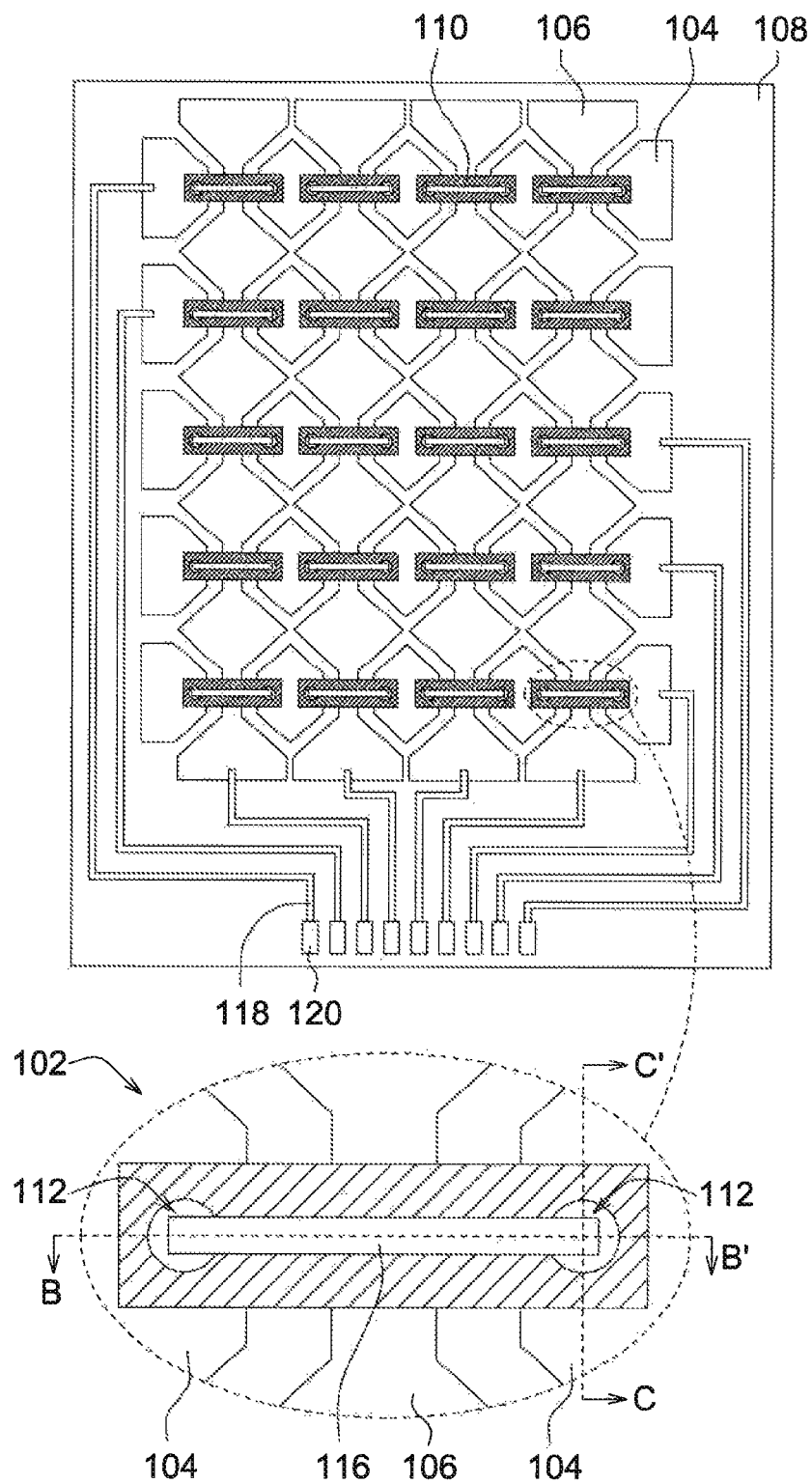
FIG. 1A shows an upper view of a touch structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
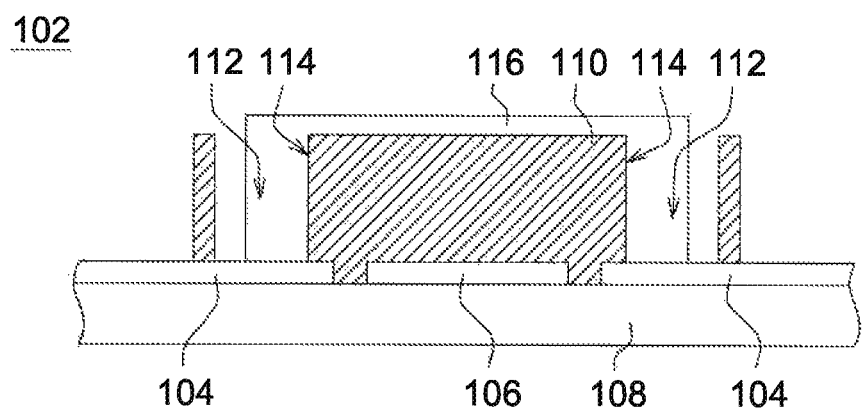
FIG. 1B shows a cross-sectional view of a touch structure according to one embodiment.
Figure 1C:
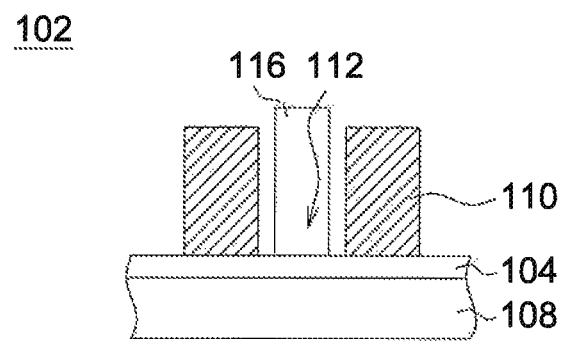
FIG. 1C shows a cross-sectional view of a touch structure according to one embodiment.

FIG. 1A shows an upper view of a touch structure according to one embodiment. FIG. 1B shows a cross-sectional view of the touch structure of FIG. 1A along BB' line. FIG. 1C shows a cross-sectional view of the touch structure of FIG. 1A along CC' line. In one embodiment, the touch structure is a projection capacitive touch structure.

Referring to FIG. 1A to FIG. 1C, the touch structure comprises sensing units 102. First patterned electrodes 104 and second patterned electrodes 106 are disposed on a substrate 108. The first patterned electrodes 104 and the second patterned electrodes 106 are separated from each other. The substrate 108 may comprise a flexible base material or a rigid base material. The flexible base material may comprise polyethylene terephthalate, polycarbonate, a flexible glass or other suitable materials. The flexible base material may comprise single-sheet base material or rolled base material. The rigid base material may comprise a rigid glass or other suitable materials.

The second patterned electrode 106 is disposed between the first patterned electrodes 104. For example, the first patterned electrodes 104 separated by the second patterned electrode 106 are arranged along a first direction. The second patterned electrode 106 is extended in a second direction different from the first direction. In one embodiment, for example, the first direction is the X-axial direction, and the second direction is the Y-axial direction.

The first patterned electrodes 104 and the second patterned electrode 106 can be formed by patterning a conductive film (not illustrated) formed on the substrate 108. The conductive film may comprise metal or other suitable materials. For example, the conductive film may comprise a transparent material and so on. The conductive layer 126 may comprise such as inorganics or organics and so on. The inorganics may comprise oxides such as ITO, FTO, ZnO, AZO, IZO and so on. For example, the organics may comprise conductive/conjugated polymer, nanometer metal, carbon nanotubes, graphene, and nanometer silver line and so on. The conductive film may comprise single transparent conductive layer (single ITO; SITO), double transparent conductive layers (double ITO; DITO), one glass solution (OGS) glass, or conventional touch on lens (TOL). The conductive film can be formed by a deposition process such as a vacuum coating process, a printing process such as R2R process, or other suitable methods. The patterning step comprises a photolithographic process. In some embodiments, the first patterned electrode 104 and the second patterned electrode 106 may be formed by a printing process without using a patterning process. The printing process does not require a series of complicated procedures of thin film deposition and photolithographic etching, hence largely simplifying the process, shortening production time and increasing production. The first patterned electrode 104 and the second patterned electrode 106 may comprise metal or other suitable materials. For example, the first patterned electrode 104 and the second patterned electrode 106 may comprise transparent conductive oxides, organic transparent conductive materials or carbon nanotubes and so on.

In one embodiment, for example, the first patterned electrodes 104 and the second patterned electrode 106 are disposed on the same plane of the substrate 108, hence largely reducing hollowing ratio and top/down alignment caused from a double-layered conductive film of a structural design to the first patterned electrode 104 and the second patterned electrode 106, and obtaining better imaging effect and higher sensitivity and precision. In addition, the structural design using a single-layered conductive film can achieve light-weight and thinness at the same time.

A dielectric structure 110 is disposed on the first patterned electrode 104 and the second patterned electrode 106 separated from each other. In the example, the dielectric, structure 110 covers partial of the first patterned electrode 104 and the second patterned electrode 106. The dielectric structure 110 has a dielectric opening 112 formed therein. In the example, the dielectric openings 112 are dielectric holes respectively exposing the corresponding first patterned electrodes 104 and dielectric sidewalls 114 (FIG. 1B).

The dielectric structure 110 having the dielectric opening 112 can be formed by patterning a dielectric thin film (not shown) formed on the first patterned electrode 104 and the second patterned electrode 106. The dielectric thin film may be formed by a deposition process such as a vacuum coating process, a printing process such as R2R process, or other suitable methods. The patterning step comprises the photolithographic etching process. In some embodiments, the dielectric structure 110 having the dielectric opening 112 may be directly formed by a printing process without using a patterning process. The printing process does not require a series of complicated procedures of thin film deposition and photolithographic etching, hence largely simplifying the process, shortening production time and increasing production. The dielectric structure 110 comprises a dielectric material, comprising a resin, etc., such as a photosensitive resin or a thermosetting resin, or an inorganic transparent dielectric insulating material such as silica.

In the example, a conductive bridge 116 is disposed across a partial of the dielectric structure 110 and is extended on the dielectric sidewall 114 exposed from the dielectric opening 112 (that is, the dielectric hole) for electrically connecting the first patterned electrodes 104 separated by the second patterned electrode 106 to each other. In one embodiment, the conductive bridge 116 may fully fill the dielectric opening 112 substantially. The conductive bridge 116 may be formed by patterning a conductive film (not shown) formed on the dielectric structure 110. The conductive film may be formed by a deposition process such as a vacuum coating process, a printing process such as R2R process, or other suitable methods. The patterning step comprises a photolithographic etching process.

In some embodiments, the conductive bridge 116 may be directly formed by a printing process without using a patterning process. The printing process does not require a series of complicated procedures of thin film deposition and photolithographic etching, hence largely simplifying the process, shortening production time and increasing production. In addition, since the dielectric structure 110 has the dielectric opening 112 (that is, the dielectric hole), a printing conductive glue for the conductive bridge 116 can be precisely controlled and guided into the dielectric opening 112 to form excellent electrical connection with the first patterned electrode 104 in the conductive structure. Therefore, the short-circuiting problem caused from the conductive glue being overbanked to unexpected areas such as the short-circuiting between the adjacent first patterned electrode 104 and second patterned electrode 106 can be avoided, and the conductive bridge 116 can have better electrical properties or physical qualities such as uniform width and thickness.

The conductive bridge 116 may comprise metal or other suitable materials. For example, the conductive bridge 116 may comprise a metal-containing material, such as a conductive silver paste, a copper-containing metal, or a multi-layered material containing molybdenum, aluminum, and molybdenum. The conductive bridge 116 may comprise a transparent conductive ink. The transparent conductive ink comprises a metal oxides material, an organic transparent conductive material or a transparent conductive material with a mixture of organics and inorganics.

In one embodiment, for example, the first patterned electrode 104, the second patterned electrode 106, the dielectric structure 110 and the conductive bridge 116 are not limited to be formed by the same manufacturing method such as the printing method or the method used for patterning a thin film. The choice of the manufacturing method can be based on the selection of materials and equipment as well as the consideration of cost.

As indicated in FIG. 1A, the first patterned electrodes 104, the second patterned electrodes 106 and the conductive bridges 116 form a matrix structure. The first patterned electrodes 104 and the second patterned electrodes 106 may be coupled to touch terminals 120 through conductive connection wires 118 to form a projection capacitive touch sensing element. The conductive connection wires 118 may comprise a metal-containing material. The metal-containing material may comprise a conductive silver paste, a copper-containing metal or a multi-layered material formed by molybdenum, aluminum, and molybdenum, or other suitable materials.

Figure 2A:
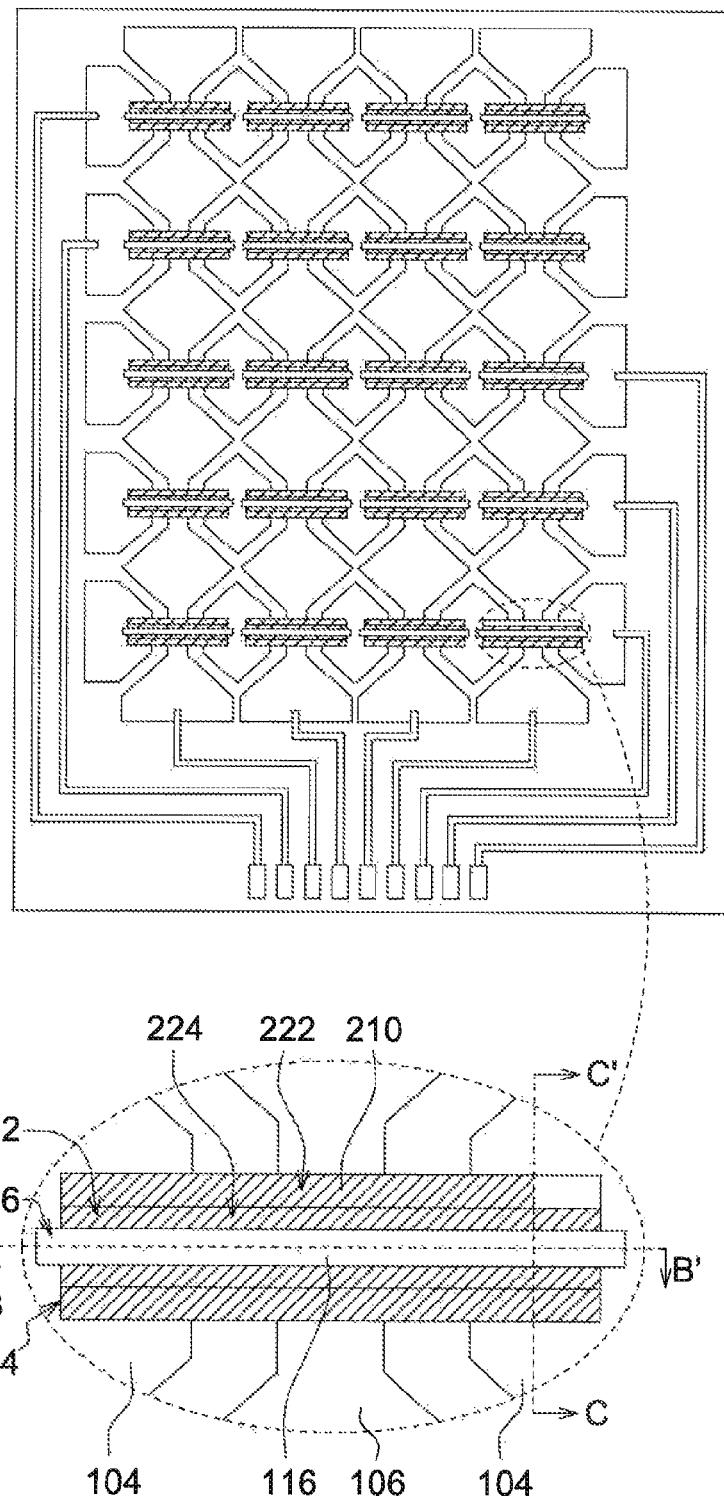
FIG. 2A shows an upper view of a touch structure according to one embodiment.
Figure 2B:
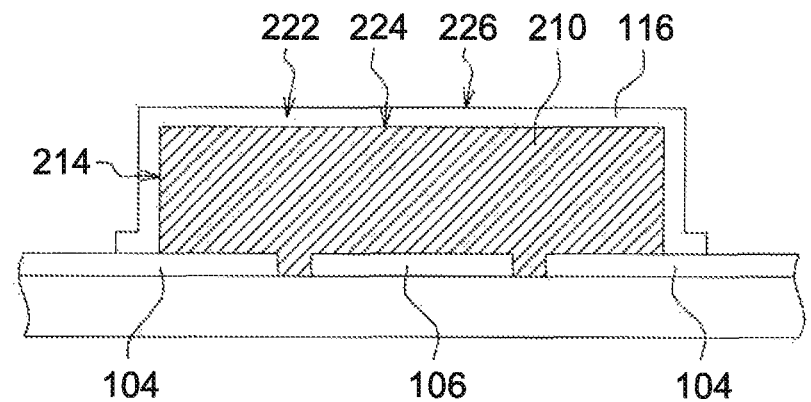
FIG. 2B shows a cross-sectional view of a touch structure according to one embodiment.
Figure 2C:
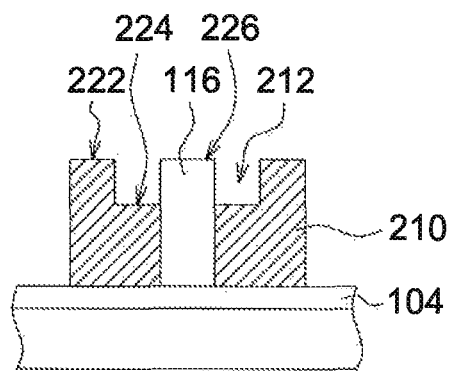
FIG. 2C shows a cross-sectional view of a touch structure according to one embodiment.

FIG. 2A shows an upper view of a touch structure according to one embodiment. FIG. 2B shows a cross-sectional view of the touch structure of FIG. 2A along BB' line. FIG. 2C shows a cross-sectional view of the touch structure of FIG. 2A along CC' line. The touch structure of FIG. 2A to FIG. 2C is different from the touch structure of FIG. 1A to FIG. 1C in that the dielectric opening 212 of the dielectric structure 210 is a dielectric trench. The dielectric structure 210 has a first upper dielectric surface 222 and a second upper dielectric surface 224. The dielectric opening 212 (that is, the dielectric trench) is extended towards the inside of the dielectric structure 210 from the first upper dielectric surface 222 and exposes the second upper dielectric surface 224. In other words, the first upper dielectric surface 222 is higher than the second upper dielectric surface 224. The conductive bridge 116 is extended on the second upper dielectric surface 224 exposed from the dielectric opening 212 (that is, dielectric trench), and extended on the dielectric sidewall 214 and disposed across the entire dielectric structure 210 for electrically connecting the first patterned electrodes 104 separated by the second patterned electrode 106 to each other.

In some embodiments, the conductive bridge 116 may be directly formed by the printing process without using the patterning process, hence largely simplifying the process, shortening production time and increasing production. In addition, since the dielectric structure 210 has the dielectric opening 212 (that is, the dielectric trench), the printing conductive glue for the conductive bridge 116 can be precisely controlled and guided into the dielectric opening 212 in conductive structure. Therefore, the short-circuiting problem caused from the conductive glue being overbanked to unexpected areas can be avoided, and the conductive bridge 116 can have better electrical properties or physical qualities such as uniform width and thickness. In some embodiments, a top surface 226 of the conductive bridge 116 is controlled to be not higher than a top surface of the dielectric structure 210. For example, the top surface 226 of the conductive bridge 116 is substantially co-planer with the first upper dielectric surface 222 of the dielectric structure 210, or disposed between the first upper dielectric surface 222 and the second upper dielectric surface 224. The above structural design avoids the structure that the conductive bridge 116 is protruded from the dielectric structure 210 and would be broken due to the compression stress in subsequent processes such as a lamination or a compression process which provides a compression stress. Therefore, product reliability is improved and conformity rate is increased.

Figure 3A:
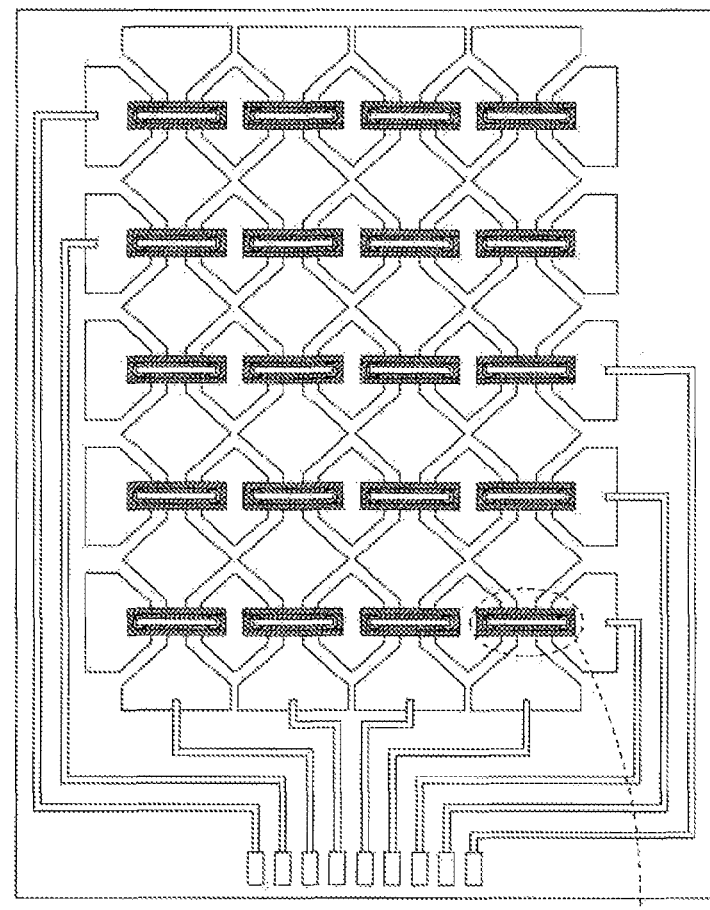
FIG. 3A shows an upper view of a touch structure according to one embodiment.
Figure 3A:
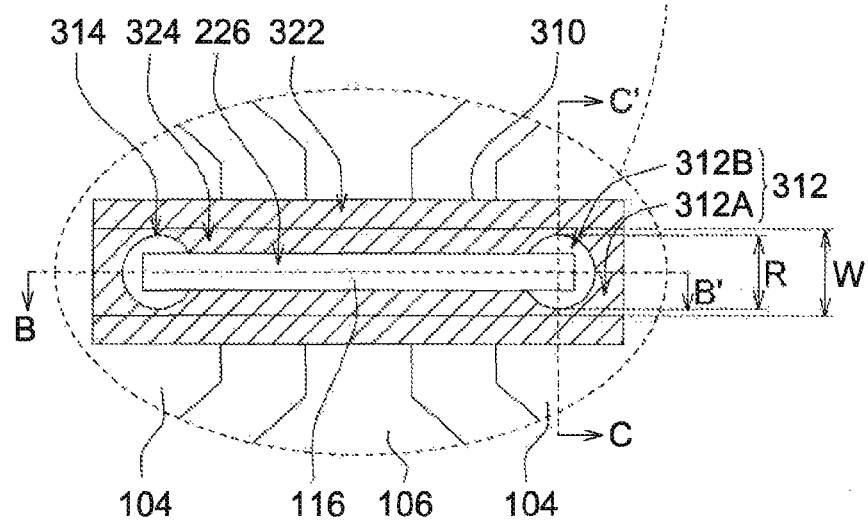
Figure 3B:
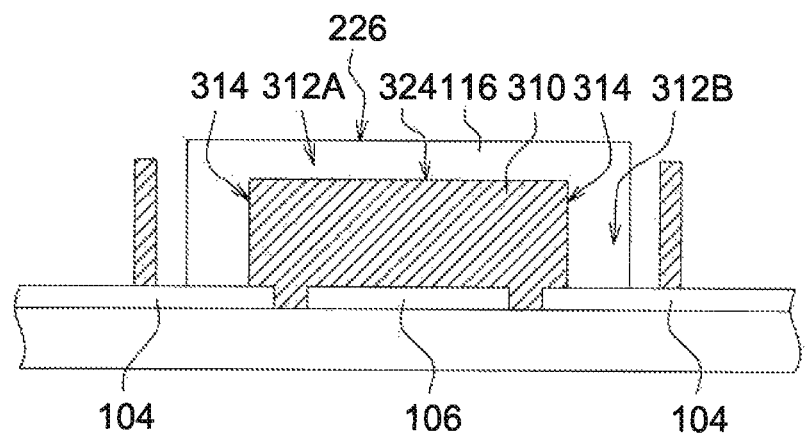
FIG. 3B shows a cross-sectional view of a touch structure according to one embodiment.
Figure 3C:
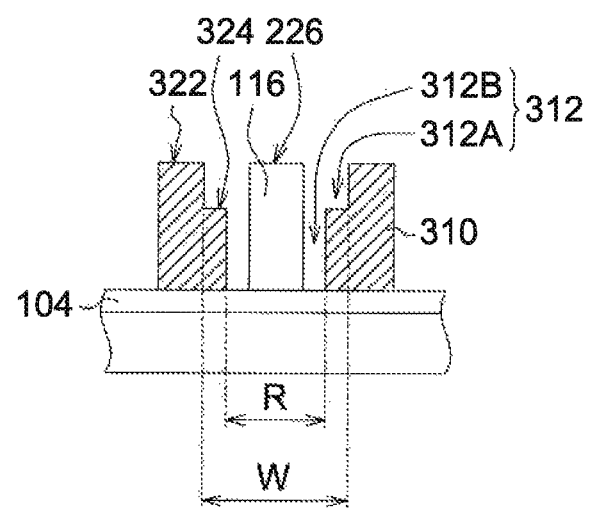
FIG. 3C shows a cross-sectional view of a touch structure according to one embodiment.

FIG. 3A shows an upper view of a touch structure according to one embodiment. FIG. 3B shows a cross-sectional view of the touch structure of FIG. 3A along BB' line. FIG. 3C shows a cross-sectional view of the touch structure of FIG. 3A along CC' line. The touch structure of FIG. 3A to FIG. 3C is different from the touch structure of FIG. 2A to FIG. 2C in that the dielectric opening 312 of the dielectric structure 310 comprises a dielectric trench 312A and dielectric holes 312B communicated to the dielectric trench 312A. The dielectric trench 312A is extended towards the inside of the dielectric structure 310 from the first upper dielectric surface 322 and exposes the second upper dielectric surface 324. The dielectric holes 312B respectively expose the corresponding first patterned electrodes 104 and the dielectric sidewalls 314.

Referring to FIG. 3A to FIG. 3C, the conductive bridge 116 is extended on the second upper dielectric surface 324 exposed from the dielectric trench 312A of the dielectric opening 312, and extended on the dielectric sidewall 314 exposed from the dielectric holes 312B so as to cross a partial of the dielectric structure 310 for electrically connecting the first patterned electrodes 104 separated by the second patterned electrode 106 to each other. In one embodiment, the conductive bridge 116 may fully fill the dielectric holes 312B of the dielectric opening 312, substantially. Referring to FIG. 3A and FIG. 3C, in the example, for example, a diameter R of the dielectric holes 312B is smaller than a width W of the dielectric trench 312A.

In some embodiments, the conductive bridge 116 can be directly formed by the printing process without using the patterning process, hence largely simplifying the process, shortening production time and increasing production. Since the dielectric structure 310 has a dielectric opening 312 each comprising the dielectric trench 312A and the dielectric holes 312B, the printing conductive glue for the conductive bridge 116 can be precisely controlled and guided into the dielectric opening 312 in the conductive structure. Therefore, the short-circuiting problem caused from the conductive glue being overbanked to unexpected areas can be avoided, and the conductive bridge 116 can have better electrical properties or physical qualities such as uniform width and thickness and forms excellent electrical connection with the first patterned electrodes 104. In some embodiments, the top surface 226 of the conductive bridge 116 is controlled to be not higher than the top surface of the dielectric structure 310. For example, the top surface 226 of the conductive bridge 116 is substantially co-planer with the first upper dielectric surface 322 of the dielectric structure 310, or disposed between the first upper dielectric surface 322 and the second upper dielectric surface 324. The above structural design avoids the structure that the conductive bridge 116 is protruded from the dielectric structure 310 and would be broken due to the compression stress in subsequent processes such as a lamination or a compression process which provides a compression stress. Therefore, product reliability is improved and conformity rate is increased.

Figure 4A:
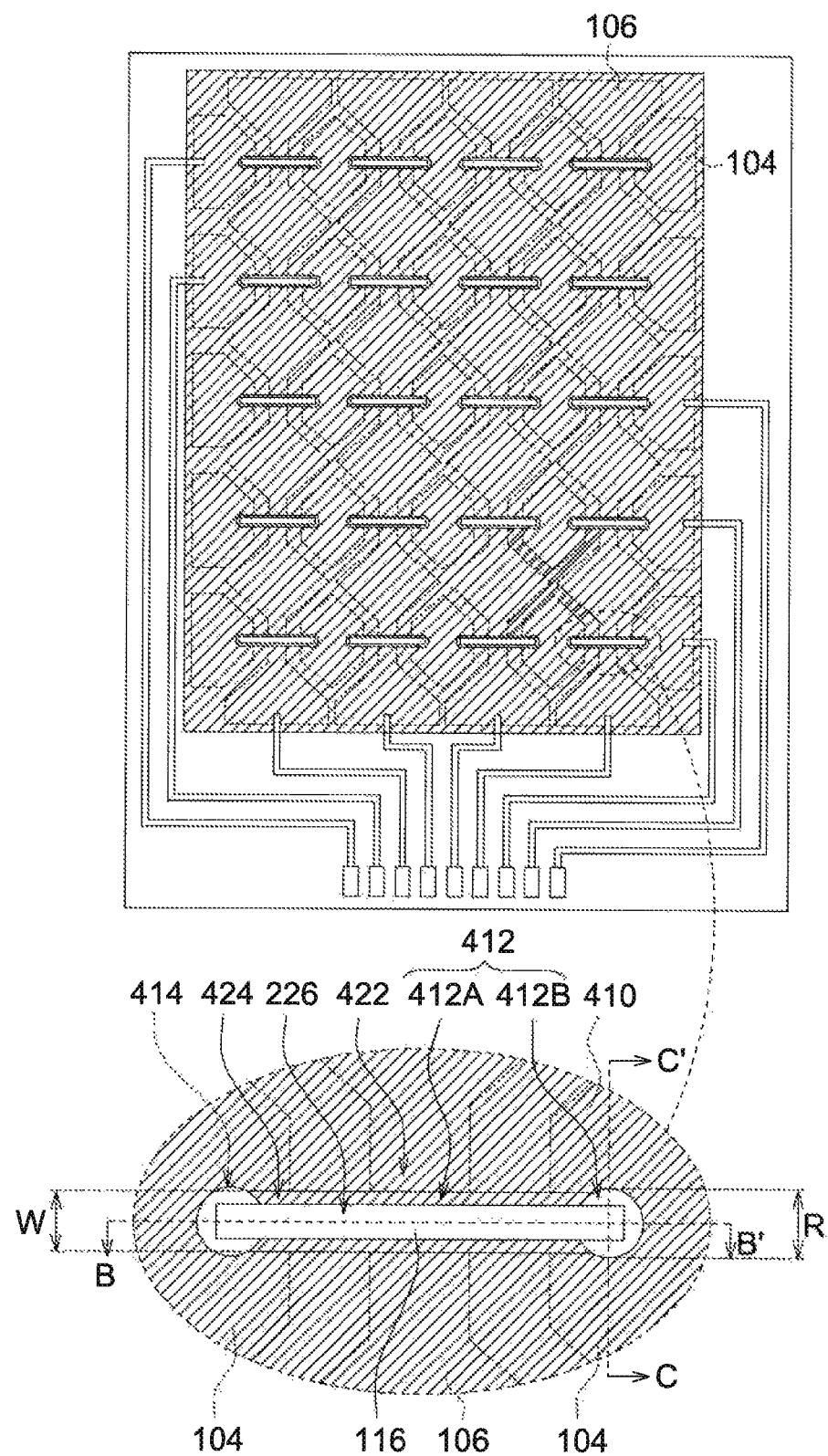
FIG. 4A shows an upper view of a touch structure according to one embodiment.
Figure 4B:
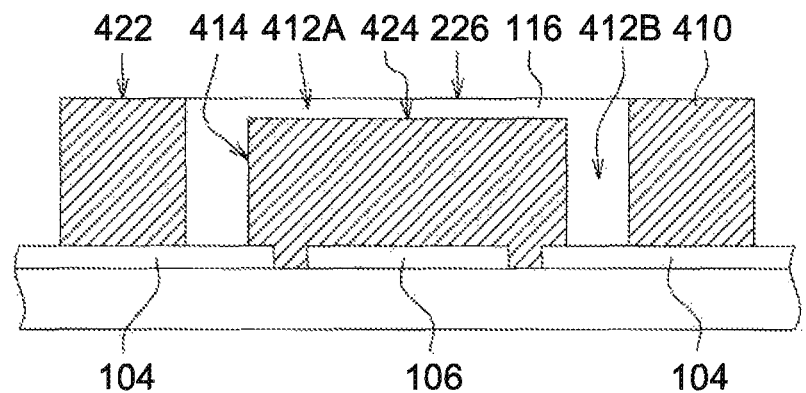
FIG. 4B shows a cross-sectional view of a touch structure according to one embodiment.
Figure 4C:
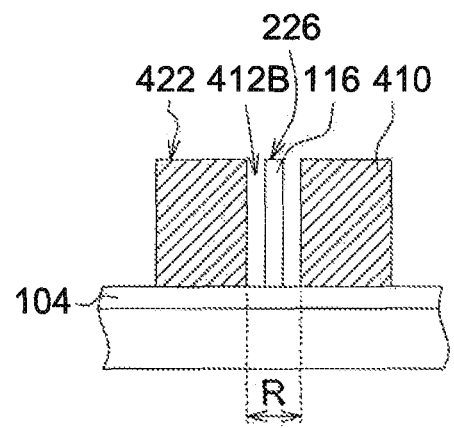
FIG. 4C shows a cross-sectional view of a touch structure according to one embodiment.

FIG. 4A shows an upper view of a touch structure according to one embodiment. FIG. 4B shows a cross-sectional view of the touch structure of FIG. 4A along BB' line. FIG. 4C shows a cross-sectional view of the touch structure of FIG. 4A along CC' line. The touch structure of FIG. 4A to FIG. 4C is different from the touch structure of FIG. 3A to FIG. 3C in that the dielectric structure 410 covers all of the first patterned electrodes 104 and the second patterned electrode 106.

Referring to FIG. 4A to FIG. 4C, the dielectric opening 412 of the dielectric structure 410 comprises a dielectric trench 412A and dielectric holes 412B communicated to the dielectric trench 412A. The conductive bridge 116 is extended on the second upper dielectric surface 424 exposed from the dielectric trench 412A, and extended on the dielectric sidewall 414 exposed from the dielectric holes 412B to cross a partial of the dielectric structure 410 for electrically connecting the first patterned electrodes 104 separated by the second patterned electrode 106 to each other. Referring to FIG. 4A, in the present example, for example, the diameter R of the dielectric holes 412B is larger than the width W of the dielectric trench 412A.

In some embodiments, the conductive bridge 116 can be directly formed by the printing process without using the patterning process, hence largely simplifying the process, shortening production time and increasing production. Since the dielectric structure 410 has the dielectric opening 412 each comprising the dielectric trench 412A and the dielectric hole 412B, the printing conductive glue for the conductive bridge 116 can be precisely controlled and guided into the dielectric opening 412 in the conductive structure. Therefore, the short-circuiting problem caused from the conductive glue being overbanked to unexpected areas can be avoided, and the conductive bridge 116 can have better electrical properties or physical qualities such as uniform width and thickness and forms excellent electrical connection with the first patterned electrodes 104. The dielectric structure 410, which covers all of the first patterned electrodes 104 and the second patterned electrode 106, reduces the likelihood of the short-circuiting problem caused from the conductive glue being overbanked to unexpected areas. In some embodiments, the top surface 226 of the conductive bridge 116 is controlled to be not higher than the top surface of the dielectric structure 410. For example, the top surface 226 of the conductive bridge 116 is substantially co-planer with the first upper dielectric surface 422 of the dielectric structure 410, or disposed between the first upper dielectric surface 422 and the second upper dielectric surface 424. The above structural design avoids the structure that the conductive bridge 116 is protruded from the dielectric structure 410 and would be broken due to the compression stress in subsequent processes such as a lamination or a compression process which provides a compression stress. Therefore, product reliability is improved and conformity rate is increased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A touch structure, comprising:
   first patterned electrodes;
   a second patterned electrode disposed between the first patterned electrodes and separated from the first patterned electrodes;
   a dielectric structure disposed on the first patterned electrodes and the second patterned electrode, wherein the dielectric structure has a dielectric opening; and
   a conductive bridge disposed across the dielectric structure and extended in the dielectric opening, wherein the first patterned electrodes are electrically connected to each other through the conductive bridge.

2. The touch structure according to claim 1, wherein the dielectric opening comprises a dielectric trench and/or dielectric holes, and the conductive bridge is extended in the dielectric trench and/or the dielectric holes.

3. The touch structure according to claim 2, wherein the dielectric holes expose the corresponding first patterned electrodes.

4. The touch structure according to claim 2, wherein the dielectric structure has a first upper dielectric surface and a second upper dielectric surface, the dielectric trench is extended towards an inside of the dielectric structure from the first upper dielectric surface so as to expose the second upper dielectric surface.

5. The touch structure according to claim 2, wherein the dielectric trench and the dielectric holes are communicated to each other.

6. The touch structure according to claim 1, wherein the dielectric opening comprises dielectric holes respectively exposing the corresponding first patterned electrodes, and the conductive bridge is extended into the dielectric holes for electrically connecting the first patterned electrodes exposed from the dielectric holes to each other.

7. The touch structure according to claim 1, wherein
   the dielectric opening comprises a dielectric trench,
   the dielectric structure has a first upper dielectric surface, a second upper dielectric surface and a dielectric sidewall,
   the dielectric trench is extended towards an inside of the dielectric structure from the first upper dielectric surface so as to expose the second upper dielectric surface,
   the conductive bridge is extended on the second upper dielectric surface exposed from the dielectric trench and extended on the dielectric sidewall for electrically connecting the first patterned electrodes to each other.

8. The touch structure according to claim 7, wherein the dielectric opening further comprises dielectric holes exposing the corresponding first patterned electrodes and exposing the dielectric sidewall on which the conductive bridge is extended.

9. The touch structure according to claim 1, wherein the dielectric structure covers partial or all of the first patterned electrodes and the second patterned electrode.

10. A manufacturing method of a touch structure, comprising:
    disposing first patterned electrodes on a substrate;
    disposing a second patterned electrode on the substrate, wherein the second patterned electrode is disposed between the first patterned electrodes;
    disposing a dielectric structure on the first patterned electrodes and the second patterned electrode,
    forming a dielectric opening in the dielectric structure; and
    disposing a conductive bridge across the dielectric structure and extending in the dielectric opening, wherein the first patterned electrodes are electrically connected to each other through the conductive bridge.

* * * * *